US010326337B2

United States Patent
Omura et al.

(10) Patent No.: US 10,326,337 B2
(45) Date of Patent: Jun. 18, 2019

(54) POWER TOOL HAVING A HEAT RADIATION MEMBER FOR A CONTROLLER

(71) Applicant: MAKITA CORPORATION, Anjo-shi, Aichi (JP)

(72) Inventors: Motohiro Omura, Anjo (JP); Ryosuke Suzuki, Anjo (JP); Hideyuki Taga, Anjo (JP)

(73) Assignee: MAKITA CORPORATION, Anjo-Shi (JP)

( * ) Notice: Subject to any disclaimer, the term of this patent is extended or adjusted under 35 U.S.C. 154(b) by 759 days.

(21) Appl. No.: 14/792,008

(22) Filed: Jul. 6, 2015

(65) Prior Publication Data

US 2016/0020676 A1    Jan. 21, 2016

(30) Foreign Application Priority Data

Jul. 17, 2014   (JP) ................. 2014-146680

(51) Int. Cl.
*H02K 9/22* (2006.01)
*B24B 23/02* (2006.01)
(Continued)

(52) U.S. Cl.
CPC ............. *H02K 9/22* (2013.01); *B24B 23/028* (2013.01); *B25F 5/008* (2013.01); *H02K 7/145* (2013.01);
(Continued)

(58) Field of Classification Search
CPC .......... H02K 7/145; H02K 9/22; H02K 11/33; H05K 7/20436; H05K 7/205; B24B 23/028; B25F 5/008
(Continued)

(56) References Cited

U.S. PATENT DOCUMENTS

2004/0212961 A1   10/2004   Harris
2009/0229957 A1    9/2009   Nishimiya et al.
(Continued)

FOREIGN PATENT DOCUMENTS

JP        2000-252657 A    9/2000
JP        2003-332526 A    11/2003
(Continued)

OTHER PUBLICATIONS

Sanada et al., English Machine Translation of JP 2000-252657.*
(Continued)

*Primary Examiner* — Bernard Rojas
*Assistant Examiner* — Rashad H Johnson
(74) *Attorney, Agent, or Firm* — Oliff PLC

(57) ABSTRACT

In an electric power tool which houses a motor and a controller for controlling drive of the motor, the controller has a circuit board on which electric components are mounted and a heat radiation member which radiates heat of the electric components. The heat radiation member has a facing part which faces the circuit board in parallel to a board surface of the circuit board. The facing part is provided with steps by which a distance between the facing part and the board surface of the circuit board varies. Furthermore, the facing part of the heat radiation member is provided with a first facing part in which a relative distance with respect to the board surface of the circuit board is reduced.

20 Claims, 11 Drawing Sheets

(51) Int. Cl.
  *H05K 7/20* (2006.01)
  *B25F 5/00* (2006.01)
  *H02K 7/14* (2006.01)
  *H02K 11/33* (2016.01)
(52) U.S. Cl.
  CPC ............. *H02K 11/33* (2016.01); *H05K 7/205* (2013.01); *H05K 7/20436* (2013.01)
(58) Field of Classification Search
  USPC .............................................. 310/50, 64, 71
  See application file for complete search history.

(56) References Cited

U.S. PATENT DOCUMENTS

| | | | |
|---|---|---|---|
| 2010/0253162 A1 | 10/2010 | Sakamaki et al. | |
| 2010/0283332 A1* | 11/2010 | Toukairin | B25F 5/008 310/50 |
| 2011/0187211 A1* | 8/2011 | Matsunaga | B25F 5/008 310/50 |
| 2013/0119792 A1 | 5/2013 | Nishimiya et al. | |
| 2013/0255981 A1* | 10/2013 | Noto | B25F 5/001 173/20 |
| 2017/0225315 A1* | 8/2017 | Okouchi | B25F 5/02 |
| 2017/0353020 A1* | 12/2017 | Yamashita | H05K 7/20445 |

FOREIGN PATENT DOCUMENTS

| | | |
|---|---|---|
| JP | 2007-283447 A | 11/2007 |
| JP | 2008-173716 A | 7/2008 |
| JP | 2009-214260 A | 9/2009 |
| JP | 2013-254742 A | 12/2013 |

OTHER PUBLICATIONS

Sasaki et al., English Machine Translation of JP 2003-332526.*
Dec. 15, 2017 Office Action issued in Japanese Patent Application No. JP 2014-146680.

* cited by examiner

POWER TOOL HAVING A HEAT RADIATION MEMBER FOR A CONTROLLER

CROSS-REFERENCE

This application claims priority to Japanese patent application Serial Number 2014-146680, filed on Jul. 17, 2014, the contents of which are incorporated herein by reference in their entirety.

TECHNICAL FIELD

The present invention generally relates to an electric power tool capable of driving a motor by a controller.

BACKGROUND ART

An electric power tool that includes an electric motor as a drive source is well known. Rotational drive of the electric motor is performed by a controller mounted in the electric power tool. The controller includes a circuit board that can control rotational drive of the electric motor. The circuit board includes a bridge circuit for controlling electric power to the electric motor (for example, refer to Japanese Laid-Open Patent Application No. 2009-214260). Generally, the controller may generate heat by the supplied electric power, and accordingly, a heat radiation member for radiating the heat is provided in the controller.

In the above electric power tool, built-in components may be required to reduce in size and thickness for improving operability. Furthermore, the above-described controller and the circuit board of the controller may be required to reduce in size and thickness as well. Similarly, a heat radiation member may also be required to reduce in size and thickness. However, when the heat radiation member is simply reduced in size or thickness, it may be difficult to perform sufficient heat exchange, which may reduce the heat radiation effect by the heat radiation member.

In view of the above, there is a need to obtain the sufficient heat radiation effect of the controller itself while reducing the size and thickness of the controller including the circuit board and the heat radiation member in the electric power tool.

SUMMARY

The present disclosure generally relates to an electric power tool which houses a motor and a controller for controlling drive of the motor. The controller may comprise a circuit board on which electric components are mounted and a heat radiation member which radiates heat of the electric components. The heat radiation member may have a facing part which faces the circuit board in parallel to a board surface of the circuit board. The facing part may be provided with steps by which a distance between the facing part and the board surface of the circuit board is configured to vary. Furthermore, the facing part of the heat radiation member may be provided with a first facing part in which a relative distance with respect to the board surface of the circuit board is reduced.

Because of this construction, the facing part may be used to effectively radiate heat which the electric components may generate. The facing part may be configured to be formed corresponding to the electric components which are mounted on the circuit board, and the electric components may be selectively mounted on the circuit board. In this respect, the heat radiation effect of the controller itself may be increased while the size and thickness of the controller including the circuit board and the heat radiation member may be reduced.

In another exemplary embodiment of the disclosure, the electric components may have a switching device for supplying electric power to the motor, and the first facing part may contact the switching device such that heat is exchanged between the first facing part and the switching device. Because of this construction, the first facing part may contact the switching devices, and thus heat may be exchanged between the first facing part and the switching devices. In this respect, the heat radiation member may increase the efficiency of heat exchange with respect to the switching devices. Accordingly, the heat radiation effect by the heat radiation member may be further increased.

In another exemplary embodiment of the disclosure, the electric components may be classified according to a protrusion amount from the board surface of the circuit board on which the electric components are mounted, and the electric components may be mounted on areas sectioned on the board surface of the circuit board according to the classifications. The facing part may have the first facing part and a second facing part such that a distance between the first facing part and the board surface of the circuit board may differ from that between the second facing part and the board surface of the circuit board by the steps. Furthermore, the first facing part and the second facing part may correspond to the areas sectioned on the board surface of the circuit board according to the classifications.

Because of this construction, the relative distances between the board surface of the circuit board and the heat radiation member may correspond to the protrusion amount from the board surface of the electric components. Accordingly, the relative distances between the board surface of the circuit board and the heat radiation member may vary corresponding to the electric components while the size and thickness of the controller having the circuit board and the heat radiation member may be reduced. In this respect, the heat radiation effect of the heat radiation member may be further increased.

In another exemplary embodiment of the disclosure, in a case where the electric components are classified into three or more, relationship between the first facing part and the second facing part may be configured to be two or more. Because of this construction, the relative distances between the board surface of the circuit board and the heat radiation member may vary in detail corresponding to the protrusion amount of the electric components from the board surface. Therefore, the heat radiation effect of the heat radiation member may be increased more efficiently while the size and thickness of the controller may be reduced.

In another exemplary embodiment of the disclosure, the classifications may comprise a first group which forms a group of switching devices for supplying electric power to the motor. The first group may be arranged in a first area sectioned on the board surface of the circuit board. Furthermore, the first facing part may be configured to correspond to the first area. Because of this construction, heat radiation of the switching devices for supplying electric power to the motor may be advantageously and/or effectively improved.

In another exemplary embodiment of the disclosure, the classifications may comprise a second group which forms a group of electric components for controlling the switching devices. The second group may be arranged in a second area sectioned on the board surface of the circuit board. Furthermore, the second facing part may be configured to correspond to the second area. Because of this construction, heat radiation of the electric components for controlling the switching devices may be advantageously and/or effectively improved.

In another exemplary embodiment of the disclosure, the classifications may comprise a third group which forms a group of electric wires for supplying electric power from a power source to the motor. The third group may be arranged in a third area sectioned on the board surface of the circuit board. Furthermore, the second facing part is configured to correspond to the third area. Because of this construction, heat radiation of the electric wires for supplying electric power from the power source to the motor may be advantageously and/or effectively improved.

In another exemplary embodiment of the disclosure, two electric wires may be positioned such that a capacitor is placed between the two electric wires. Because of this construction, the two electric wires may be positioned in a dead space generated by the arrangement of the capacitor. Accordingly, the size of the circuit board may be reduced.

In another exemplary embodiment of the disclosure, an insulating sheet may be placed between the first area of the board surface of the circuit board and the first facing part of the heat radiation member such that the insulating sheet may contact both the switching devices and the first facing part, and the switching devices may be electrically insulated from the first facing part. Because of this construction, thermal conductivity between the switching devices and the heat radiation member may be increased while an electrical insulating property between the switching devices and the heat radiation member may be held. Accordingly, the heat radiation of the switching devices may be further and/or effectively increased by the heat radiation member.

In another exemplary embodiment of the disclosure, a conductor pattern for directly contacting the heat radiation member may be provided on the circuit board. Because of this construction, the heat radiation member may more easily exchange heat with the circuit board and the electric components through the conductor pattern directly contacting the heat radiation member. Accordingly, the heat radiation of the circuit board including the electric components may be further and/or effectively increased by the heat radiation member.

In another exemplary embodiment of the disclosure, the conductor pattern may be located in the first area. Because of this construction, the heat radiation of the switching devices may be more advantageously and/or effectively increased through the conductor pattern.

In another exemplary embodiment of the disclosure, the heat radiation member may be fixedly screwed to the circuit board through screw members at places where the radiation member directly contacts the conductor pattern. Because of this construction, the direct contact between the heat radiation member and the conductor pattern may be further increased. Accordingly, heat exchange between the heat radiation member and the circuit board including the electric components may be further increased through the conductive pattern.

In another exemplary embodiment of the disclosure, the screwing may be performed by screwing male screws to female screws provided in the heat radiation member. Furthermore, the male screws temporarily fixed to the female screws may function as positioning bosses when the circuit board is attached to the heat radiation member. The temporal fixing means a state where the male screws are slightly screwed to the female screws.

Because of this construction, the positioning of the circuit board with respect to the heat radiation member may be performed easily when the circuit board is attached to the heat radiation member. Therefore, the circuit board may be easily attached to the heat radiation member, and the attachment work may be easily and/or conveniently performed. Furthermore, other positioning member(s) and other positioning space(s) may not be necessary when the circuit board is attached to the heat radiation member. In this respect, the size of the controller may be advantageously reduced.

In another exemplary embodiment of the disclosure, a concave-convex shape may be formed on an outer surface part of the heat radiation member which is an opposite side of the facing part of the heat radiation member. Because of this construction, the surface area of the heat radiation member may be increased and the heat radiation effect of the electric components may be increased. Furthermore, it may be possible to suppress deformation (sink marks) generated due to the difference of the thickness when the heat radiation member is formed.

In another exemplary embodiment of the disclosure, the heat radiation member may be configured to serve as a case in which the circuit board is housed. Because of this construction, the circuit board may not be exposed and may be prevented from being damaged. Furthermore, the surface area of the heat radiation member may be defined to surround the circuit board. Accordingly, the heat radiation effect of the heat radiation member, and eventually of the circuit board including electric components may be increased.

The detailed description set forth below, when considered with the appended drawings, is intended to be a description of exemplary embodiments of the present invention and is not intended to be restrictive and/or to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures, components and/or devices are shown in block diagram form in order to avoid obscuring significant aspects of the exemplary embodiments presented herein.

DETAILED DESCRIPTION

Figure 1:
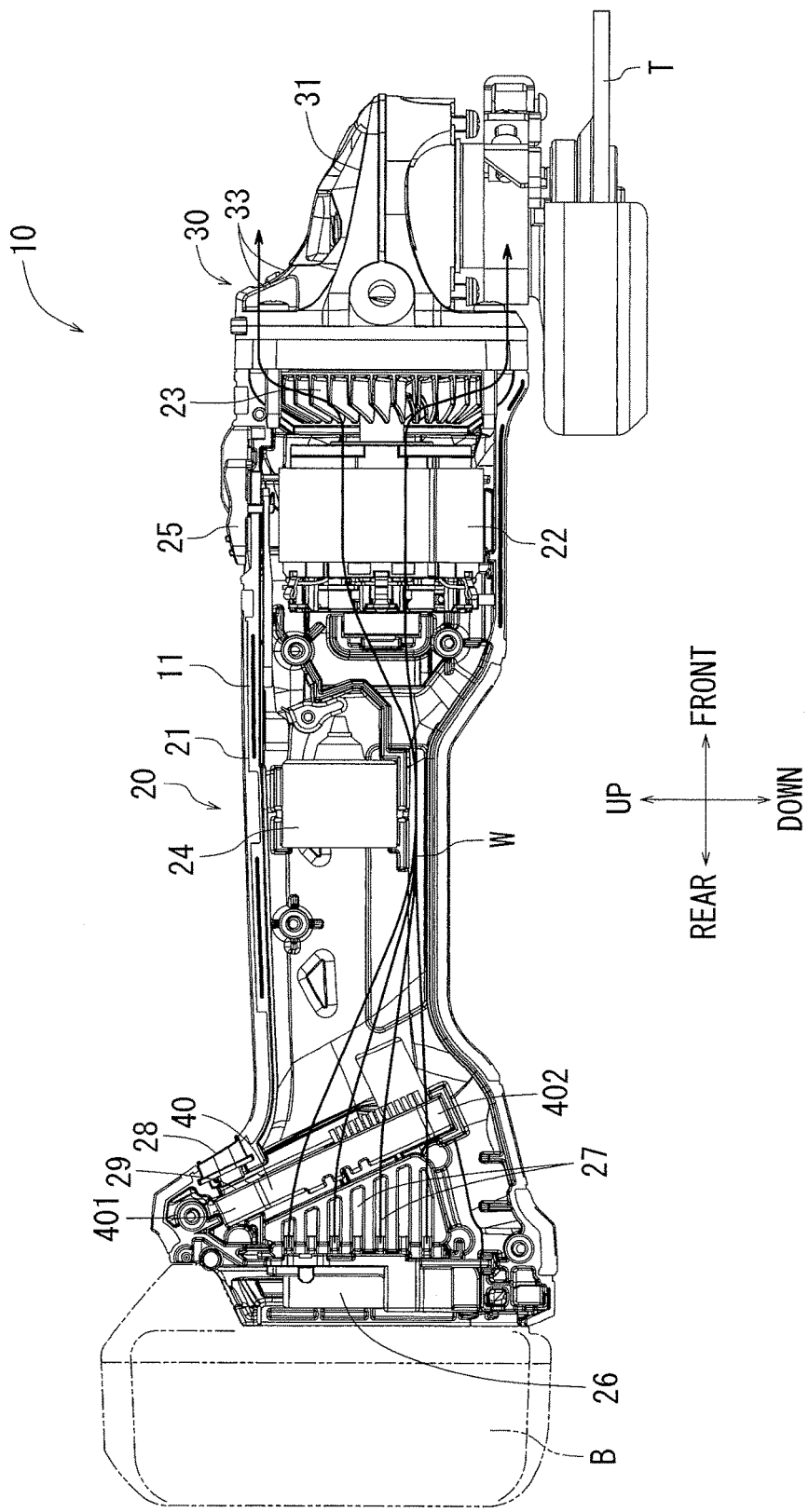
FIG. 1 is a half-cut internal structure view showing an internal structure of a disc grinder.

Hereinafter, an electric power tool according to one exemplary embodiment of the present teachings will be explained with reference to FIGS. 1 to 19. A half-cut internal structure view of FIG. 1 shows an internal structure of an electric power tool, such as a disc grinder 10, according to the present teachings. In the disc grinder 10 shown in FIG. 1, the some wirings are omitted such that the internal structure may be easily understood. The following explanation may be made referring to directions of front, rear, top, bottom, right and left written in the drawings. The disc grinder 10 is an electric power tool that may perform grinding and/or polishing by rotating a grindstone T using a brushless DC motor as a drive source. The disc grinder 10 may include a tool body 11 and a rechargeable battery B as a power source. The rechargeable battery B may be detachably attached to a battery attaching part 26 in a rear part of the tool body 11. The rechargeable battery B may be removed from the battery attaching part 26 when a charge amount is reduced, and may be charged by a dedicated charger. The rechargeable battery B may be attached to the battery attaching part 26 by sliding the rechargeable battery B from top to bottom of the battery attaching part 26, and may be removed from the battery attaching part 26 by sliding the rechargeable battery B from bottom to top thereof.

The tool body 11 may generally include a motor part 20 and a gear output part 30. The motor part 20 may include a motor housing 21 which may also serve as a handle housing. The motor housing 21 may have a tubular housing structure. The motor housing 21 may include an electric motor 22, a cooling fan 23, and an operation switch 24. The motor housing 21 may be formed by combining two half-split housings made of resin. An outer periphery of the motor housing 21 may have a handle housing shape which can be grasped by a user's hand. The electric motor 22 may be a brushless DC motor and located on a front side inside the motor housing 21. The cooling fan 23 may be located on the front side of the electric motor 22. Furthermore, the cooling fan 23 may be configured to be a centrifugal fan that rotates integrally with a motor shaft (not shown) of the electric motor 22.

As shown in FIG. 1, the operation switch 24 may be located on the rear side of the electric motor 22. The operation switch 24 may be a contact switch and turned on and off by sliding a slide lever 25 that is exposed to the outside. The slide lever 25 may be supported by the motor housing 21 so as to slide in the front and back direction. The battery attaching part 26 to which the rechargeable battery B can be attached as described above may be located at the rear of the motor housing 21. A controller 40 for driving the electric motor 22 may be located on the front side of the battery attaching part 26. The controller 40 may control driving of the electric motor 22. The controller 40 may be configured to be electrically connected to the rechargeable battery B attached to the battery attaching part 26, and electrically connected to the electric motor 22.

Furthermore, intake slits 27 may be provided between the battery attaching part 26 and the controller 40. As shown in FIG. 1, a plurality of intake slits 27, each extending in the front-back direction, may be located in a vertical direction (in the up-down direction). Outside air may be taken in through the intake slits 27 to the inside the motor housing 21 by using the cooling fan 23 (ventilation fan). Furthermore, a display device 28, which displays a remaining amount of the rechargeable battery B, may be located on an upper side of the battery attaching part 26. The display device 28 may include a display indicator and a mode selector switch (not specifically shown). The display indicator may be formed of LEDs (light emitting diodes). The mode selector switch may be a contact switch. A drive mode of the electric motor 22 may be switched by pushing the mode selector switch.

The gear output part 30 may output a rotational drive force generated by the electric motor 22. The gear output part 30 may include a gear housing 31 and a gear train (not shown) located inside the gear housing 31. The gear train may include bevel gears suitably engaged with each other, which rotates an output shaft by receiving the rotational drive of a motor shaft of the motor 22. A grindstone T may be attached to the output shaft. The gear housing 31 may be provided with an opening 33 for discharging inside air. The opening 33 may discharge internal air of the motor housing 21 to the outside by the cooling fan 23 (ventilation fan).

Next, the controller 40 will be explained below. The controller 40 may be housed inside the motor housing 21 and control the rotational drive of the electric motor 22. Furthermore, the controller 40 may include a circuit board 41 on which electric components are mounted and a heat radiation case 61 which radiates heat of the circuit board 41 and the electric components mounted thereon. The circuit board 41 and the heat radiation case 61 respectively correspond to a circuit board and a heat radiation member according to the present embodiment of the teachings. The heat radiation case 61 may serve as a case in which the circuit board 41 is housed.

Figure 2:
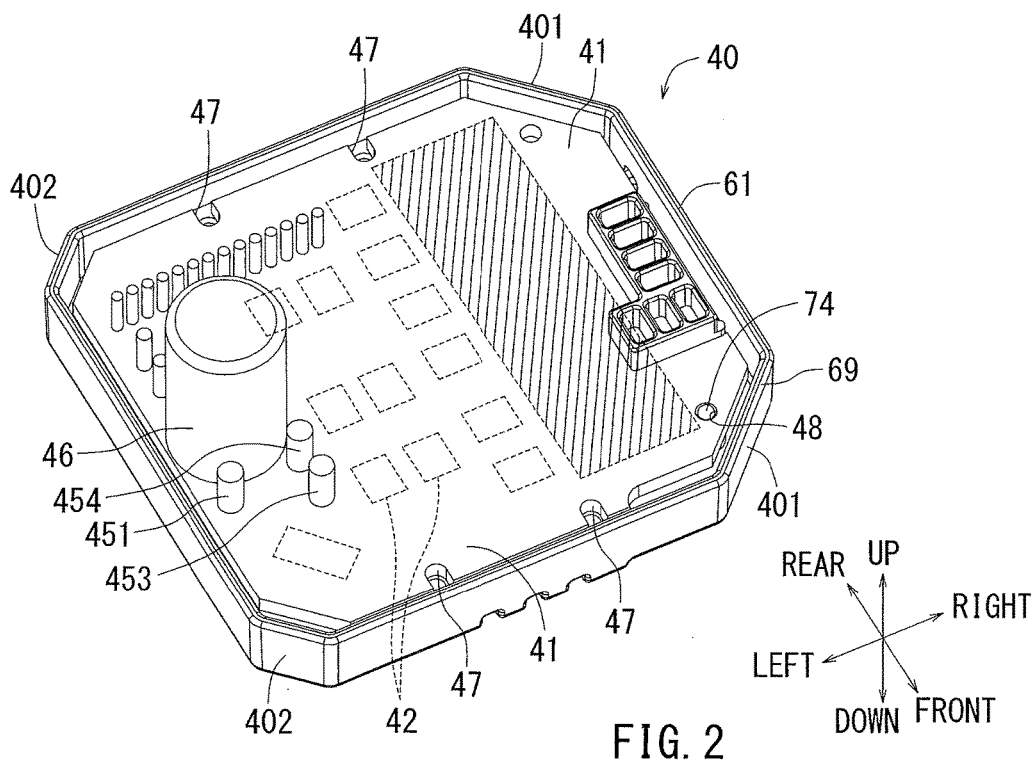
FIG. 2 is a perspective view of a controller in which a circuit board is attached to a heat radiation case.
Figure 3:
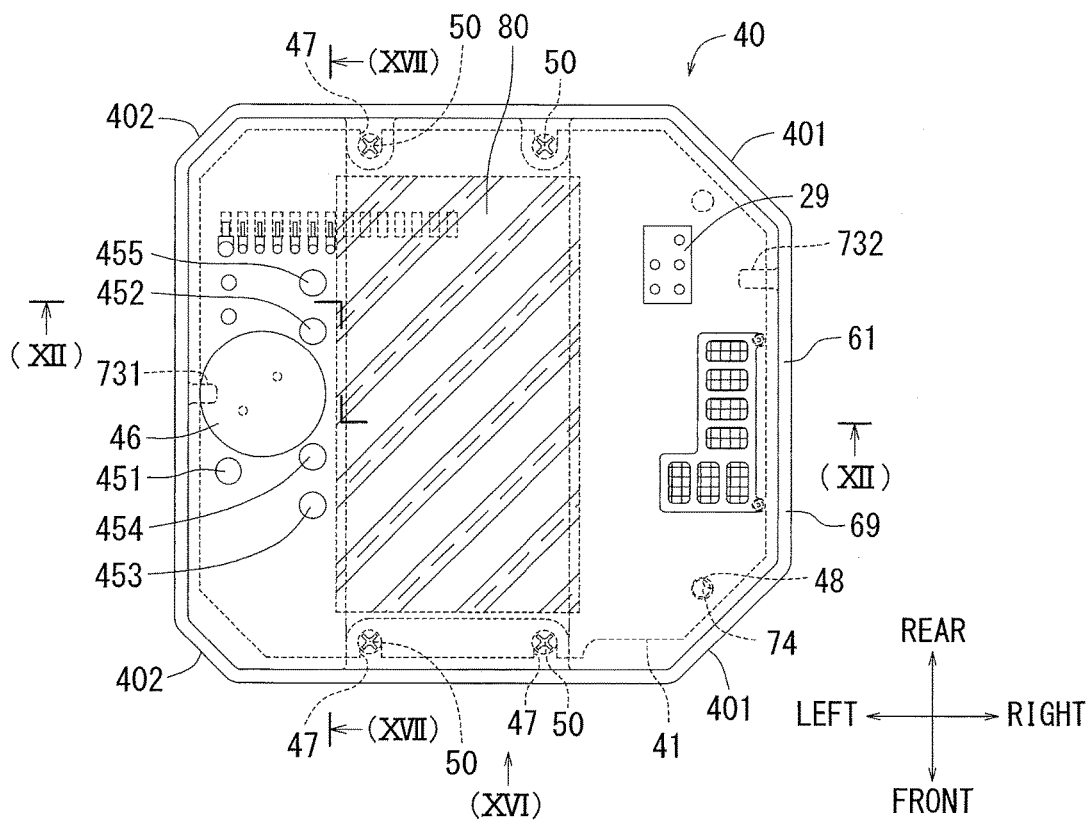
FIG. 3 is a front view of the controller shown in FIG. 2.

Referring now to FIGS. 1 and 2, a right-side part of the controller 40 may be positioned at an upper part of the motor housing 21, and a left-side part of the controller 40 may be positioned at a lower side of the motor housing 21. As shown in, for example, FIG. 2, the controller 40 may have a rectangular shape in which right-side corners are largely cut as compared with left-side corners. In more detail, the right side of the controller 40 may have first chamfer portions 401 in which corner portions are largely cut off as shown in FIG. 2 and FIG. 3. The left side of the controller 40 may have second chamfer portions 402 in which corner portions are cut off in a smaller degree than the first chamfer portions 401. As shown in, for example, FIGS. 1 and 3, an input device 29, which can be switched and input by receiving a pressing force directly from the mode selector switch of the display device 28, may be located on the right side of the controller 40, which will be described later.

The electric components may be mounted on the circuit board 41 based on the following conditions. That is, the electric components mounted on the circuit board 41 may be classified into three groups in accordance with a protrusion amount of the electric components from a board surface 43 of the circuit board 41 on which the components are mounted. Furthermore, the electric components may be collected and/or mounted on three areas sectioned on the board surface 43 of the circuit board 41 in accordance with the three classifications. That is, the electric components mounted on the circuit board 41 may be classified into a first group G1 to a third group G3. The three classifications of the first group G1 to the third group G3 may be based on the protrusion amount of the electric components from the board surface 43 of the circuit board 41 on which the components are mounted. The first group G1 may form a group of switching devices for supplying electric power to the electric motor 22. The switching devices may include a FET (field effect transistor) 42. The FET 42 mounted on the circuit board 41 may be located in a power supply path where electric power is supplied from the rechargeable battery B to the electric motor 22. The FET 42 may generate heat in the circuit board 41. The second group G2 may form a group of electric components for controlling the switching devices. The third group G3 may form a group of electric wires for supplying and/or leading electric power from the rechargeable battery B to the electric motor 22.

Figure 4:
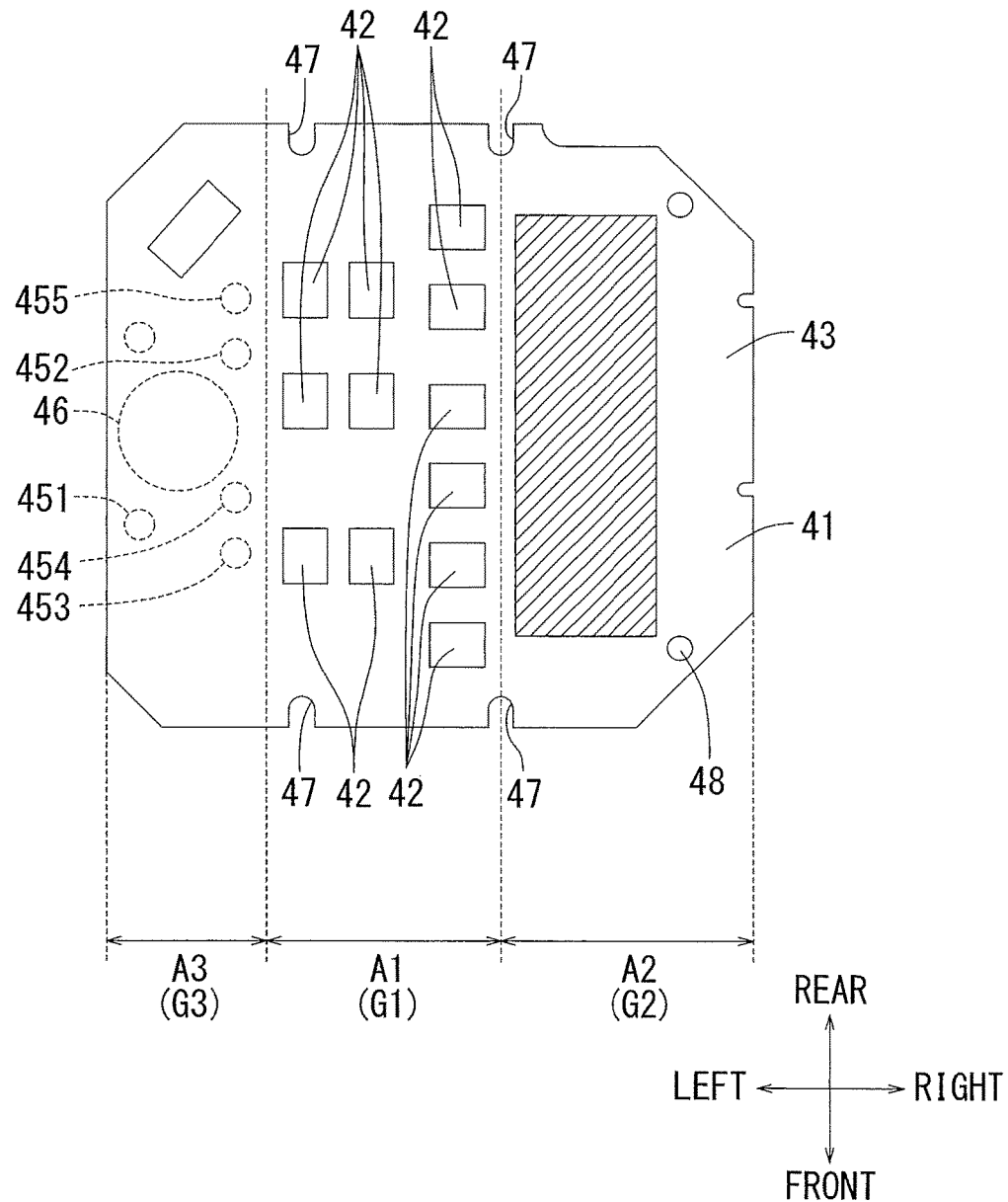
FIG. 4 is a front view of the circuit board shown in FIG. 2.

The protrusion amount of the electric components from the board surface 43 of the circuit board 41 in the first group G1 may be the smallest in the first group G1 to third group G3. On the other hand, the protrusion amount in the third group G3 may be the largest in the first group G1 to the third group G3. Furthermore, the protrusion amount in the second group G2 may be larger than that in the first group G1 and smaller than that in the third group G3. As shown in FIG. 4, the three areas may be a third area A3, a first area A1 and a second area A2 from left to right. Each area may be sectioned to cover approximately one third of the area of the board surface 43 of the circuit board 41.

As shown in, for example, FIG. 4, one third of the area of the board surface 43 on the left side may be the third area A3. Furthermore, one third on the right side may be the second area A2. The central area between the third area A3 and the second area A2 may be the first area A1. The first group G1, the second group G2, and the third group G3 may correspond to the first area A1, the second area A2, and the third area A3, respectively. That is, a plurality of FETs 42 (for example, 6 pairs of FETs, i.e., 12 FETs), the protrusion amount from the board surface 43 of the circuit board 41 of which is the smallest, may be mounted on the first area A1. A large number of electric components for controlling FETs 42, the protrusion amount from the board surface 43 of the circuit board 41 of which is the second smallest, may be mounted on the second area A2. Furthermore, as shown in FIG. 3, the input device 29, which can be switched and input by receiving the pressing force directly from the mode selector switch of the display device 28, may be mounted on the second area A2. Furthermore, electric wires 451 and 452 through which electric power is supplied and/or led from the rechargeable battery B, a capacitor 46 and three-phase electric wires 453, 454 and 455 connected to the electric motor 22 may be mounted on the third area A3. As shown in, for example, FIG. 4 and FIG. 16, the two electric wires 451 and 452 connected to the rechargeable battery B may be positioned such that the capacitor 46 are located between the electric wires 451 and 452.

Figure 5:
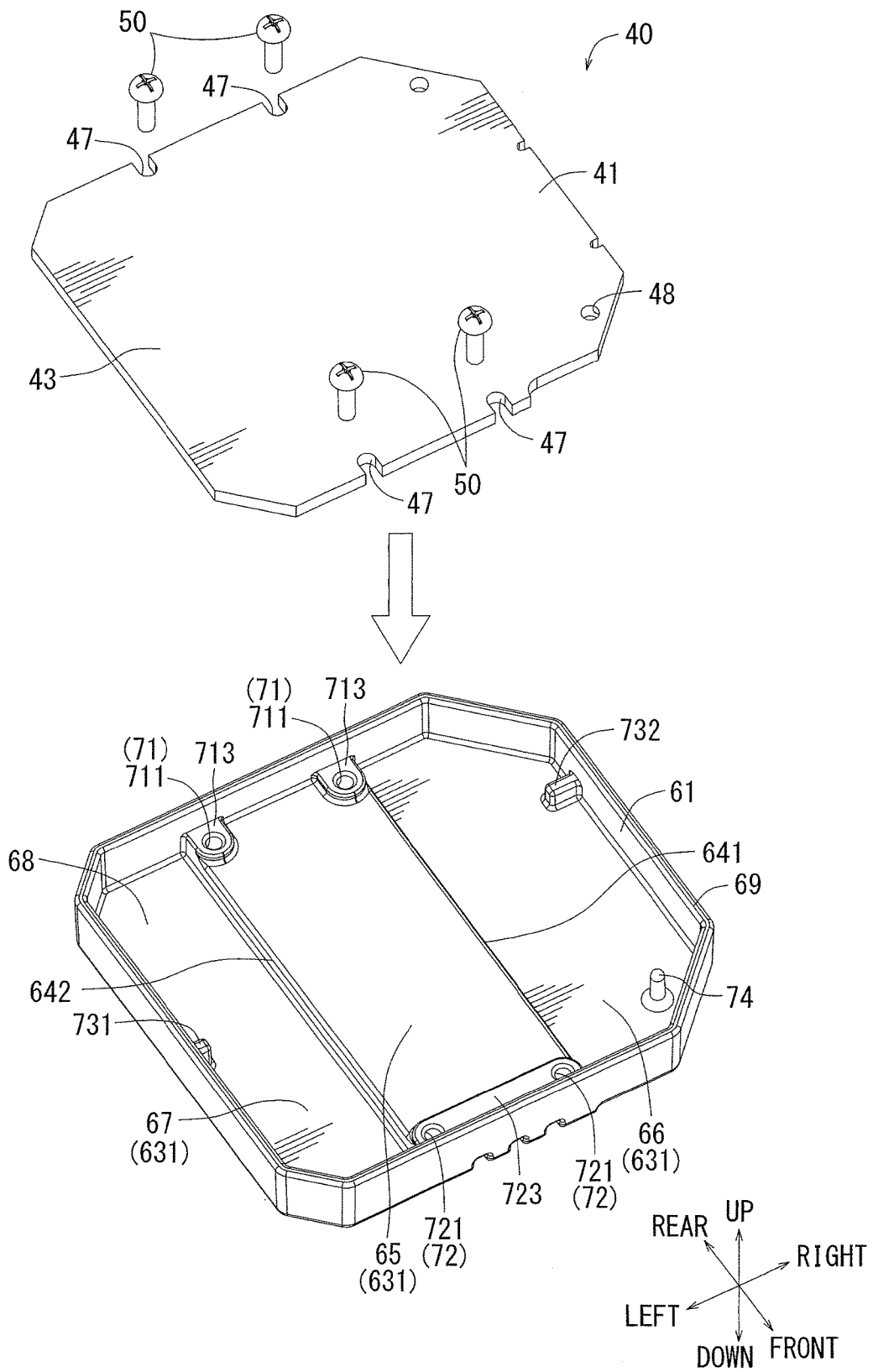
FIG. 5 is an exploded perspective view before the circuit board is attached to the heat radiation case.

As shown in FIG. 5, in the circuit board 41, four screwing grooves 47 and one positioning hole 48 may be provided in order to attach the circuit board 41 to the heat radiation case 61. The four screwing grooves 47 may correspond to female screw portions 71 and 72 of the heat radiation case 61, which will be described later. As shown in, for example, FIG. 4, two screwing grooves 47 may be located at a front-side end edge of the first area A1, and the rest two screwing grooves 47 may be located at a rear-side end edge of the first area A1. These four screwing grooves 47 may be configured to have a groove width such that male screw members 50 can be screwed to the screwing grooves. Each of the screwing grooves 47 may have a groove shape opening to the outside, and male screw members 50 can be fitted to the screwing groove 47 from the outside. The positioning hole 48, which is located near the right front part of the circuit board 41, may be fitted to a positioning pin 74 of the heat radiation case 64.

As shown in FIG. 5, the circuit board 41 may be housed in the heat radiation case 61 to form the controller 40. As shown in, for example, FIGS. 5 and 6, the heat radiation case 61 may include a facing part 631 capable of facing in parallel to the board surface 43 of the circuit board 41. Furthermore, a sidewall part 69 which stands so as to be perpendicular to an extended surface of the facing part 631 may be provided in a peripheral edge of the facing part 631. The sidewall part 69 may extend continuously from the peripheral edge of the facing part 631. A height of the sidewall part 69 may be larger than a thickness of the circuit board 41 housed inside the heat radiation case 61. The sidewall part 69 may be configured to form such that the circuit board 41 can be embedded with resin filler 90, which will be explained later with reference to FIG. 17.

Figure 6:
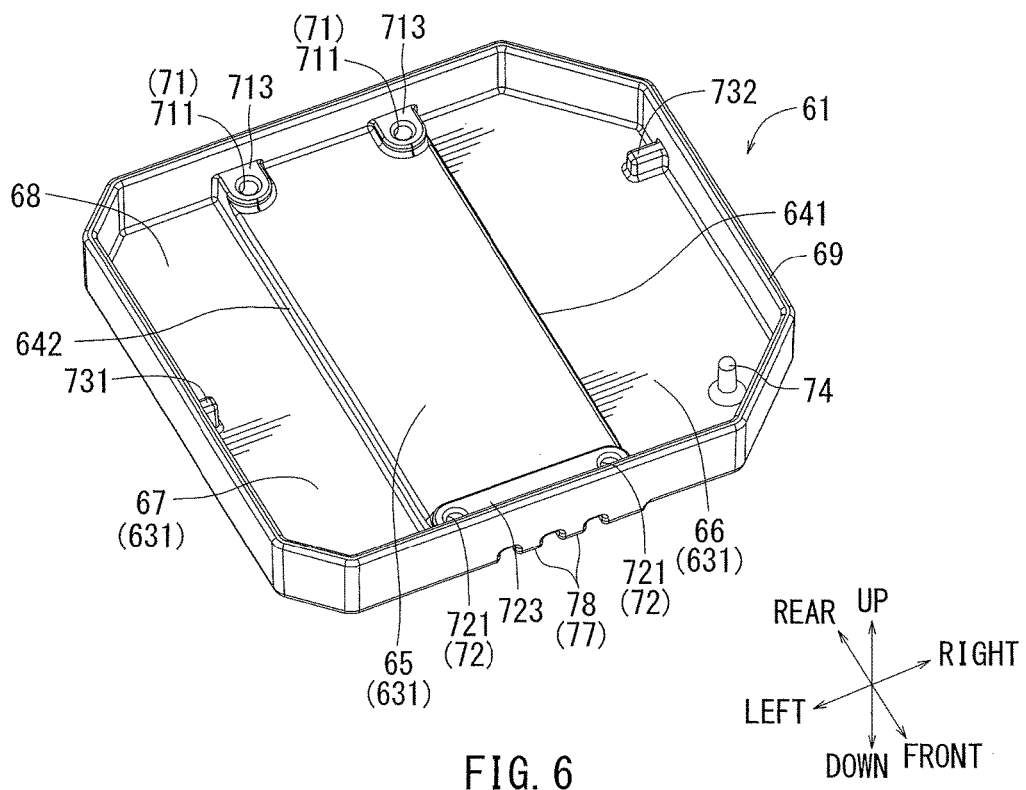
FIG. 6 is a perspective view of the heat radiation case obliquely seen from above (on an arrangement surface side of the circuit board).
Figure 9:
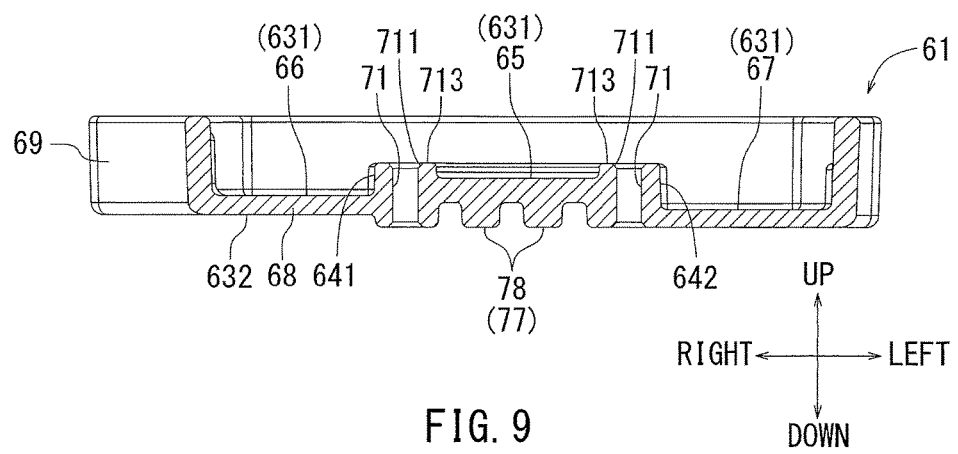
FIG. 9 is a cross-sectional view taken from line (IX)-(IX) of FIG. 8.
Figure 10:
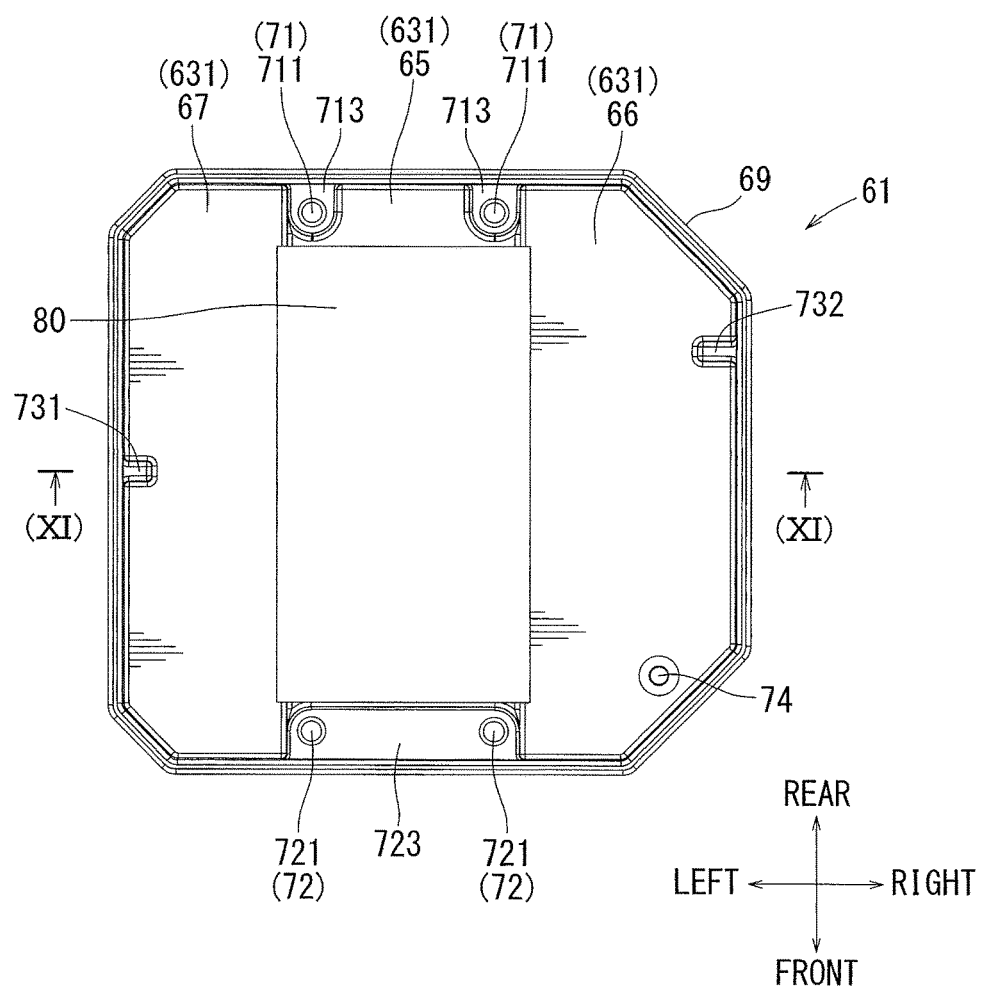
FIG. 10 is a plan view showing that an insulating sheet is placed in the heat radiation case in FIG. 8.

As shown in FIGS. 5 and 6, the facing part 631 may include a first facing part 65, a second facing part 66, and a third facing part 67. Furthermore, as shown in, for example, FIG. 12, a distance between the first facing part 65 and the board surface 43 of the housed circuit board 41 may differ from a distance between the second facing part 65 and the board surface 43. Furthermore, a distance between the second facing part 66 and the board surface 43 may differ from a distance between the third facing part 67 and the board surface 43. Furthermore, a distance between the third facing part 67 and the board surface 43 may differ from a distance between the first facing part 65 and the board surface 43. As shown in FIG. 9, a first step 641 may be provided between the first facing part 65 and the second facing part 66, and a second step 642 may be provided between the first facing part 65 and the third facing part 67. Furthermore, the second step 642 may be configured to be slightly longer than the first step 641. Accordingly, the first facing part 65, the second facing part 66 and the third facing part 67 may be configured such that relative distances with respect to the board surface 43 of the circuit board 41 differ from one another.

The first facing part 65 may be configured such that the relative distance with regard to the board surface 43 of the circuit board 41 is the closest among the three facing parts 65, 66 and 67. The second facing part 66 may be configured such that the relative distance with regard to the board surface 43 is the second closest. And the third facing part 67 may be configured such that the relative distance is the farthest. Therefore, the relationship between the first facing part 65 and the second facing part 66 may correspond to the relationship between the first facing part and the second facing part according to the present teachings which have different relative distances with respect to the board surface 43 of the circuit board 41 by the first step 641. The relationship between the first facing part 65 and the third facing part 67 may correspond to the relationship between the first facing part and the second facing part according to the present teachings which have different relative distances with respect to the board surface 43 of the circuit board 41 by the second step 642. Each area of the first facing part 65, the second facing part 66 and the third facing part 67 may respectively correspond to the areas sectioned in the board surface 43 of the circuit board 41 in accordance with the above classifications.

In more detail, the area of the first facing part 65 may correspond to the first area A1 sectioned on the board surface 43 of the circuit board 41. The area of the second facing part 66 may correspond to the second area A2 sectioned on the board surface 43 of the circuit board 41. The area of the third facing part 67 may correspond to the third area A3 sectioned on the board surface 43 of the circuit board 41. In other words, the first facing part 65 of the heat radiation case 61 may be configured such that the relative distance with respect to the board surface 43 of the circuit board 41 may become close due to the first step 641 and the second step 642. As shown in FIG. 9, a board thickness of a bottom wall part 68 of the second facing part 66 may be the same as that of the third facing part 67.

Figure 7:
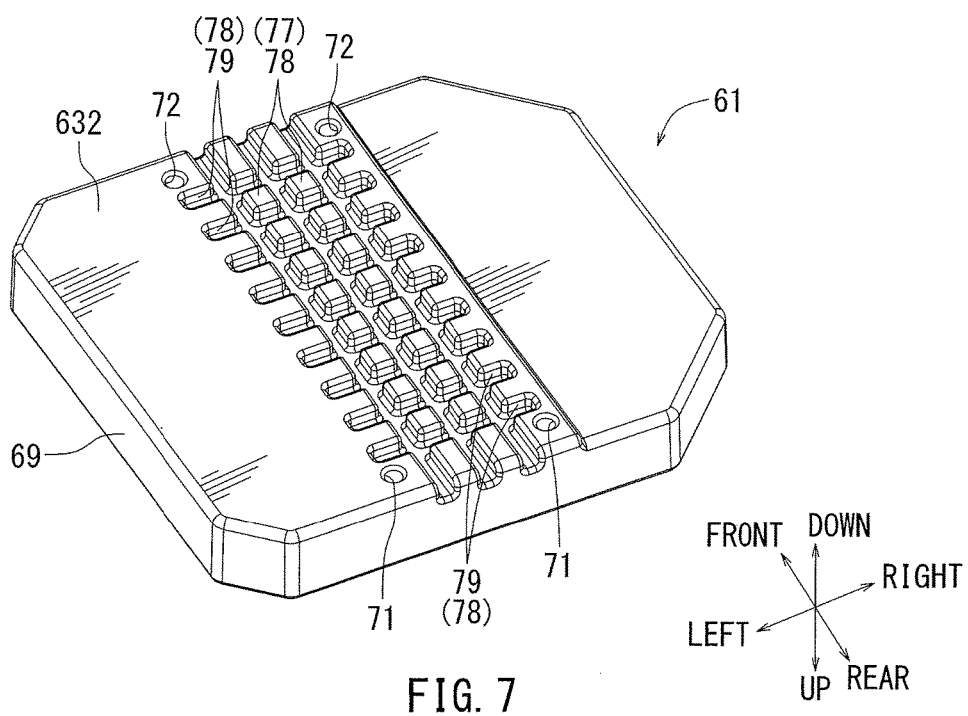
FIG. 7 is a perspective view of the heat radiation case seen obliquely from below (on an external exposure surface side of the heat radiation case).
Figure 8:
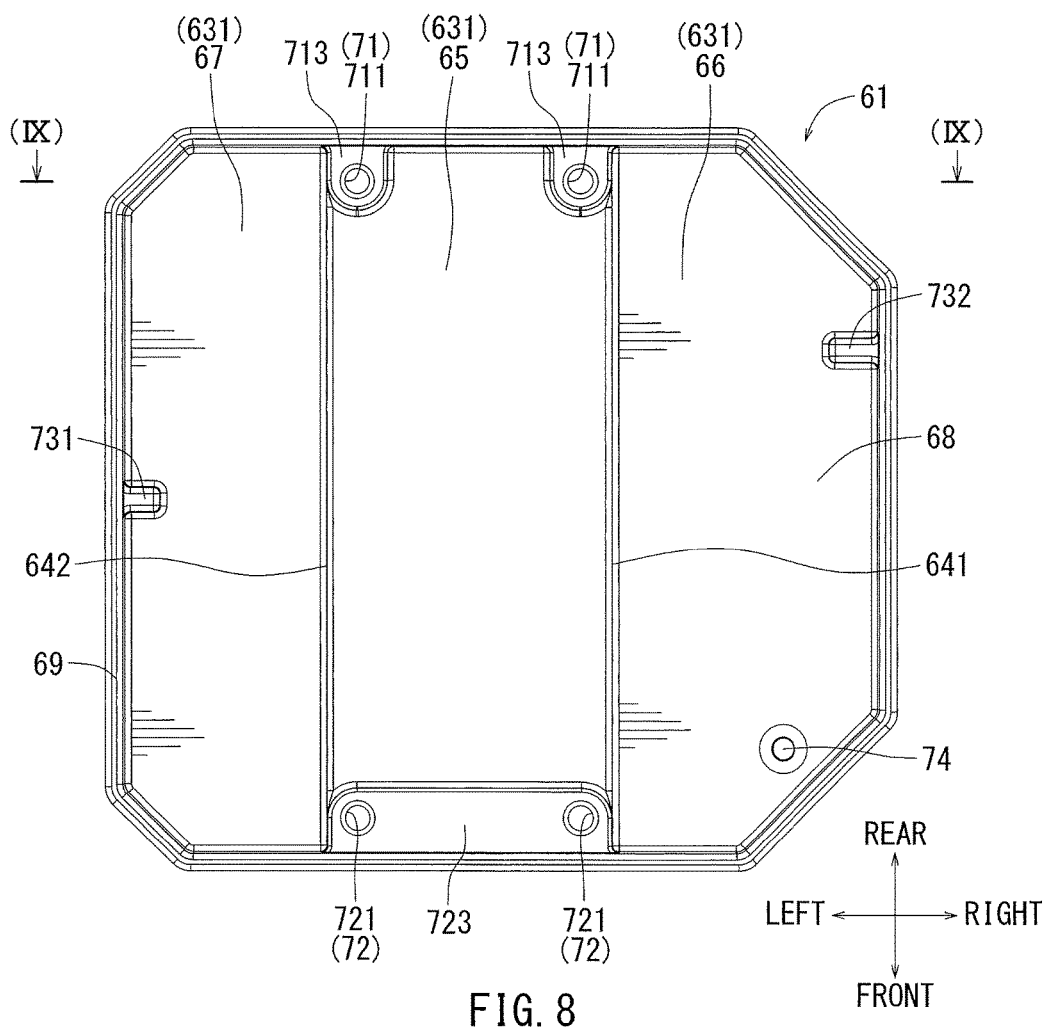
FIG. 8 is a plan view of the heat radiation case seen from above (on an arrangement surface side of the circuit board).

As shown in FIG. 7, a heat radiation structure 77 having an concave-convex shape may be provided on the outer surface part 632 which is the opposite side of the facing part 631 of the heat radiation case 61. That is, the heat radiation structure 77 may be provided on the reverse side of the first facing part 65 as shown in FIG. 6. As shown in FIG. 7, the heat radiation structure 77 may be formed by a number of rectangular column parts 78 at equal intervals in front, rear, right and left directions. Furthermore, a number of cutting grooves 79 may be formed in the end edges of the front, rear, right and left of the first facing part 65 where it is difficult to provide the rectangular column parts 78 due to the thickness of the second facing part 66 and the third facing part 67. In this way, the heat radiation structure 77 may have the concave-convex shape by providing a number of rectangular column parts 78 and the cutting grooves 79. By forming a number of rectangular column parts 78 and the cutting grooves 79, total surface area of the outer surface part 632 can be drastically increased as compared with the case where the outer surface part 632 is formed to be flat. Accordingly, efficiency of heat exchange with respect to the air may be increased by the heat radiation structure 77, and eventually, the heat radiation effect of the heat radiation case 61 may be increased. As the heat radiation structure 77 is provided in the reverse side of the first facing part 65, the heat radiation effect of the first facing part 65 may be particularly increased.

Figure 18:
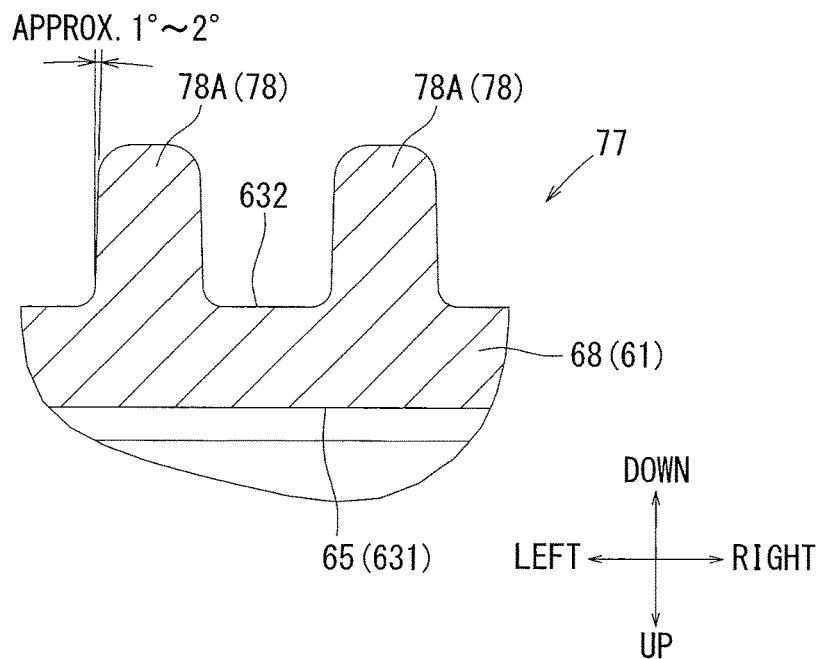
FIG. 18 is an enlarged cross-sectional view of one example of rectangular column parts of the heat radiation case.
Figure 19:
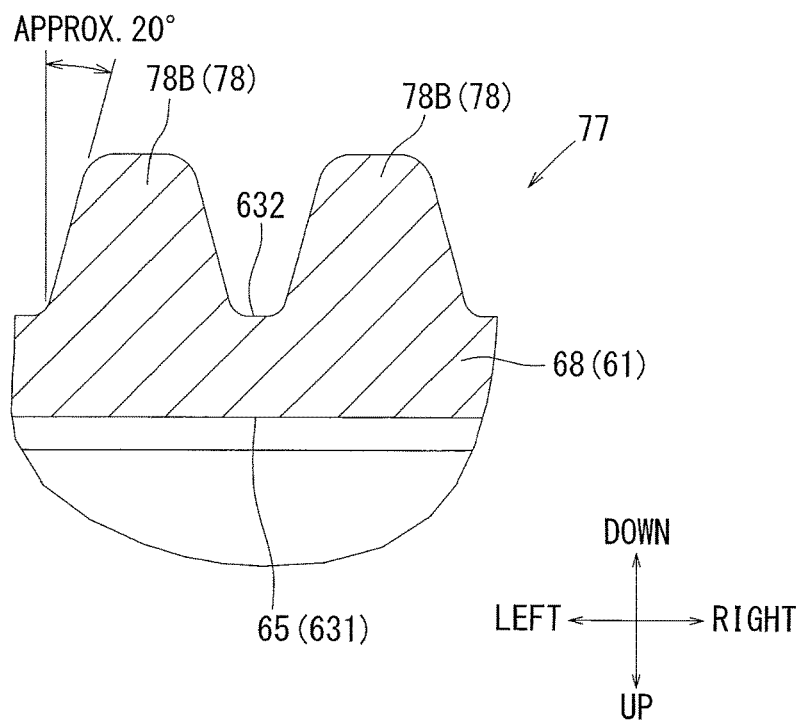
FIG. 19 is an enlarged cross-sectional view of another example of rectangular column parts of the heat radiation case.

The rectangular column parts 78 of the heat radiation structure 77 may be shown in the following two examples. FIG. 18 is a first example of the rectangular column parts 78, showing an enlarged cross-sectional view of the rectangular column parts 78 in FIG. 7. FIG. 19 is a second example of the rectangular column parts 78, showing an enlarged cross-sectional view of the rectangular column parts 78 in FIG. 7. The rectangular column parts 78A of the first example shown in FIG. 18 may have a normal draft angle. In more detail, a draft angle may be configured to be approximately 1 to 2 degrees. When the rectangular column parts 78A are formed in this manner, a mutual interval between the rectangular column parts 78A may be very small. On the other hand, the rectangular column parts 78B of the second example shown in FIG. 19 may have a larger draft angle than those of the first example. In more detail, the draft angle of the second example may be configured to be approximately 20 degrees. In the rectangular column parts 78B of the second example, a base part of each rectangular column parts 78 may be more thick than that of the first example, and a width between tip portions of the rectangular column parts 78 may be approximately the same as that of the first example.

A symbol "W" shown in FIG. 1 schematically shows a flow of the cooling air flowing into the inside of the motor housing 21. The cooling air W may be introduced by the cooling fan 23. In more detail, outside air may be taken into the inside of the motor housing 21 from intake slits 27 provided in the rear part of the motor housing by using the cooling fan 23. The outside air, i.e. the cooling air W, taken in from the intake slits 27 may be immediately hit to the heat radiation structure 77 of the heat radiation case 61. After that, the cooling air W may pass through and cool the electric motor 22 and may be discharged to the outside from the opening 33 for discharging. The controller 40 formed in an approximately rectangular shape may be positioned to be inclined with regard to the flowing direction of the cooling air W such that the cooling air W may be smoothly flowed. Furthermore, the intake slits 27 may be arranged in consideration of the position of the controller 40.

As shown in FIG. 5, the circuit board 41 may be screwed to the heat radiation case 61 by using four male screw members 50. Furthermore, the heat radiation case 61 may be provided with female screw portions 70 to which the four male screw members 50 can be screwed. The four female screw portions 70 may be respectively located at the corner of the first facing part 65. In more detail, the four female screw portions 70 may include two female screw portions 72 positioned at the front side and two female screw portions 71 positioned at the rear side. Two rear-side female screw portions 71 may be positioned to be close to the sidewall part 69 in the rear side of the first facing part 65. Furthermore, the two rear-side female screw portions 71 may be positioned to be close to the right and left side ends of the first facing part 65, respectively. Openings 711 may be provided at the two rear-side female screw portions 71 to protrude one step further than the first facing part 65 in the upward direction. Specifically, peripheral flange portions 713 on the peripheries of the openings 711 may be provided to protrude one step further than the first facing part 65 in the upward direction.

On the other hand, as shown in FIG. 5, the two front-side female screw portions 72 may be positioned to be close to the sidewall part 69 in the front side of the first facing part 65. The two front-side female screw portions 72 may be positioned to close to the right and left ends of the first facing part 65, respectively. Openings 721 may be provided at the two front-side female screw portions 72 to protrude one step further than the first facing part 65 in the upward direction. Specifically, as clearly shown in FIG. 5, the peripheries of the openings 721 may extend to form a connected flange portion 723. Unlike the peripheral flange portions 713, the connected flange portion 723 may extends along the sidewall part 69 in the front side of the first facing part 65. Furthermore, like the peripheral flange portions 713, the connected flange portion 723 may protrude one step further than the first facing part 65 in the upward direction.

The circuit board 41 may be a widely-used multilayer circuit board. The circuit board 41 may be made of glass epoxy, on which conductor patterns (not shown) electrically connected to the above-described various electric components may be provided. Ground patterns may be provided in the first area A1 of the circuit board 41 such that the ground patterns can be connected to both the peripheral flange portions 713 and the flange portion 723. When the circuit board 41 is fastened by screws to the heat radiation case 61 through the male screw members 50, the ground patterns may directly contact the peripheral flange portions 713 and the connected flange portion 723 by receiving a screw fastening force of the male screw members 50.

The heat radiation case 61 may be integrated with the circuit board 41 by screwing the four male screw members 50 to the rear-side female screw portions 71 and the front-side female screw portions 72 to attached the circuit board 41 to the heat radiation case 61. As shown in, for example, FIGS. 11 and 12, the insulating sheet 80 may be placed between the first area A1 of the board surface 43 of the circuit board 41 and the first facing part 65. The insulating sheet 80 may have at least an electrical insulating property. Ideally, the insulating sheet 80 may be made of resin having the electrical insulating property and thermal conductivity, and furthermore elasticity. The insulating sheet 80 may preferably have a high thermal conductivity. In more detail, the insulating sheet 80 may have a thermal conductivity of higher than 1.0 W/(m·K). A silicon-based resin may be used for the insulating sheet 80. The silicon-based resin has an excellent electrical insulating property and thermal conductivity. When the circuit board 41 is screwed to the heat radiation case 61, the insulating sheet 80 may be compressed and elastically deformed by a pressing force from both the first facing part 65 of the heat radiation case 61 and the board surface 43 of the circuit board 41. As shown in FIG. 13, the insulating sheet 80 may closely contact the first facing part 65 of the heat radiation case 61 and also closely contact the FETs 42 mounted on the board 43. Accordingly, the first facing part 65 of the heat radiation case 61 may be electrically insulated from the FETs 42 on the circuit board 41 by the insulating sheet 80, and also heat may be exchanged between the first facing part 65 of the heat radiation case 61 and the FET 42 on the circuit board 41 through the insulating sheet 80. Preferably, the insulating sheet 80 may be easily deformed elastically and adhered to such that the insulating sheet 80 can be easily attached to the first area A1 of the board surface 43 of the circuit board 41.

Figure 11:
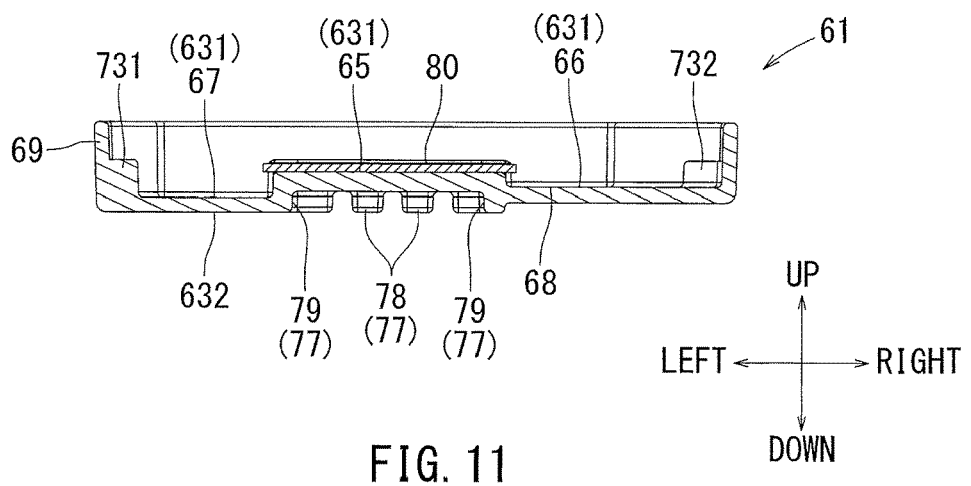
FIG. 11 is a cross-sectional view taken from line (XI)-(XI) of FIG. 10.

As shown in, for example, FIG. 5, the bottom wall part 68 of the heat radiation case 61, in which the facing part 631 (the first facing part 65, the second facing part 66 and a third facing part 67) is provided, may be provided with two supporting ribs 731 and a positioning pin 74. The two supporting ribs 731 and 732 may extend from the sidewall part 69 and protrude upward from the facing part 631. In more detail, the left-side supporting rib 731 may protrude to the right side from the sidewall part 69 and also protrude upward from the third facing part 67. In the same way, the right-side supporting rib 732 may protrude to the left side from the right-side sidewall part 69 and also protrude upward from the second facing part 66. Referring now to FIGS. 9 and 11, the third facing part 67 may be lower than the second facing part 66 in the up-down direction, and thus, as shown in FIG. 11, the protruding amount of the left-side supporting rib 731 may be configured to be longer than that of the right-side supporting rib 732 in the up-down direction.

Figure 12:
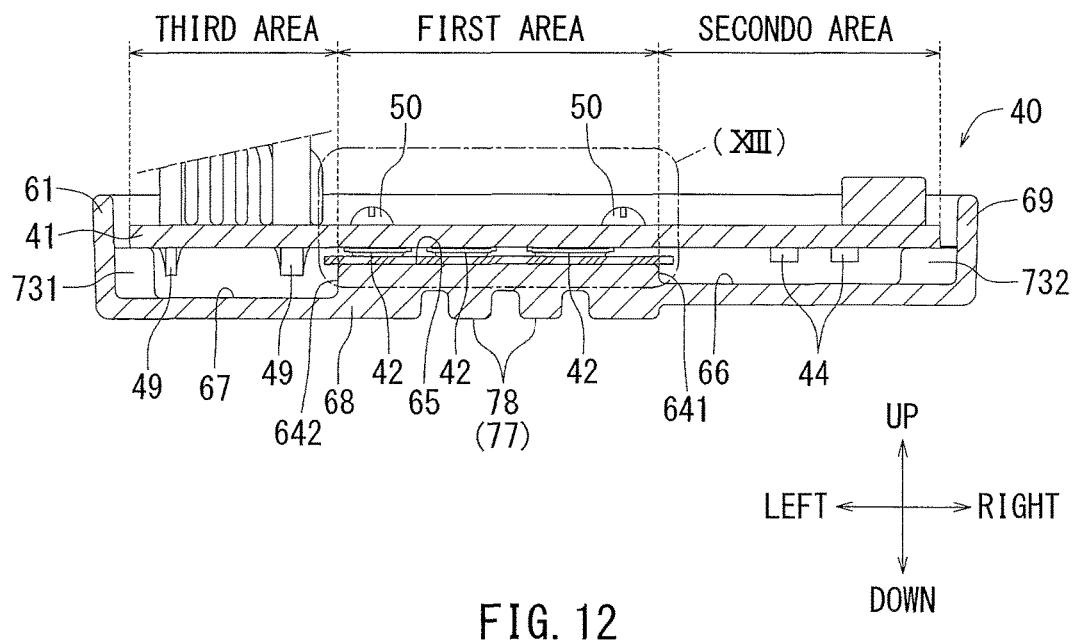
FIG. 12 is a cross-sectional view taken from zigzag line (XII)-(XII) of FIG. 3.
Figure 13:
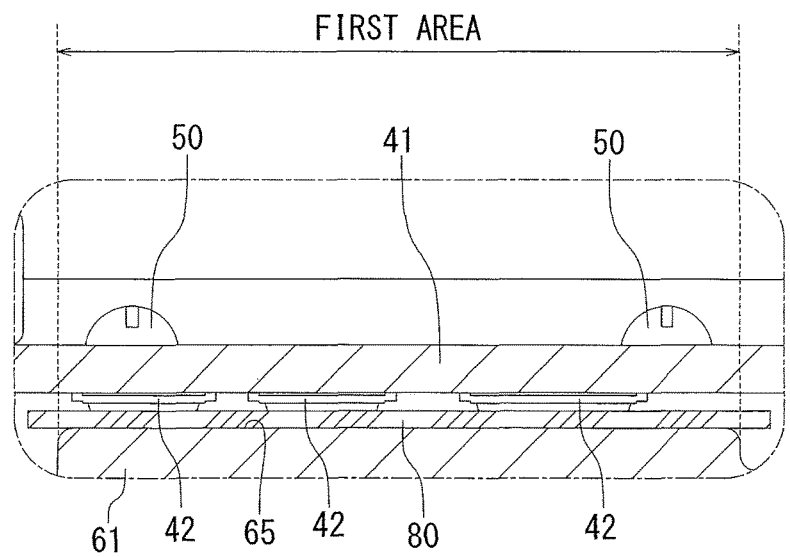
FIG. 13 is an enlarged cross-sectional view of a part (XIII) of FIG. 12.

As shown in, for example, FIGS. 3 and 12, the left-side supporting rib 731 and the right-side supporting rib 732 may respectively contact the right and left side edges of the circuit board 41, which is attached to the heat radiation case 61, and support the circuit board 41. Additionally, the left-side supporting rib 731 may be positioned so as not to interfere with the capacitor 46 mounted on the circuit board 41. The right-side support rib 732 may be positioned to correspond to the position of the mode selector switch of the display device 28. That is, the right-side support rib 732 may be positioned to correspond to the position of the input device 29, which is switched and input by pressing the mode selector switch. When the input device 29 in the circuit board 41 is pressed by receiving the pressing force of the mode selector switch, the right-side supporting rib 732 may support the circuit board 41 including the input device 29 against the pressing force. Furthermore, as shown in FIG. 3, the peripheral flange portions 713 and the connected flange portion 723 may respectively contact the rear side edge and the front side edge of the circuit board 41 to support the circuit board 41.

As shown in, for example, FIG. 5, the positioning pin 74 may be positioned close to the right front side of the bottom wall part 68. Accordingly, the positioning pin 74 may be positioned farther from the rear-side female screw portions 71. The positioning pin 74 may be fitted to the positioning hole 48 provided in the circuit board 41. Accordingly, the positioning pin 74 may protrude upward from the bottom wall part 68 with a length such that the positioning pin 74 can be fitted to the positioning hole 48 of the circuit board 48.

When the circuit board 41 is attached to the heat radiation case 61, the following procedures may be taken. First, as shown in FIG. 11, the insulting sheet 80 may be attached to the first facing part 65 of the heat radiation case 61. The first facing part 65 may be sectioned by the first step 641 and the second step 642 in the right and left directions. Accordingly, the first step 641 and the second step 642 can be used as positioning marks in the right and left directions when the insulating sheet 80 is attached. Furthermore, the first facing part 65 may also be sectioned by the sidewall 69 in the front and rear directions. Accordingly, the sidewall part 69 can be used as positioning marks in the front and rear directions when the insulating sheet 80 is attached. In this way, as the first facing part 65 may be sectioned by the first step 641, the second step 642 and the sidewall part 69, an operator can recognize an attachment area. Thus, the attachment work can be easily and conveniently performed when the insulating sheet 80 is attached to the first facing part 65. When the insulating sheet 80 is made with adhesiveness, the insulating sheet 80 can be easily adhered to the first area A1 of the board surface 43, which can improve workability.

Figure 14:
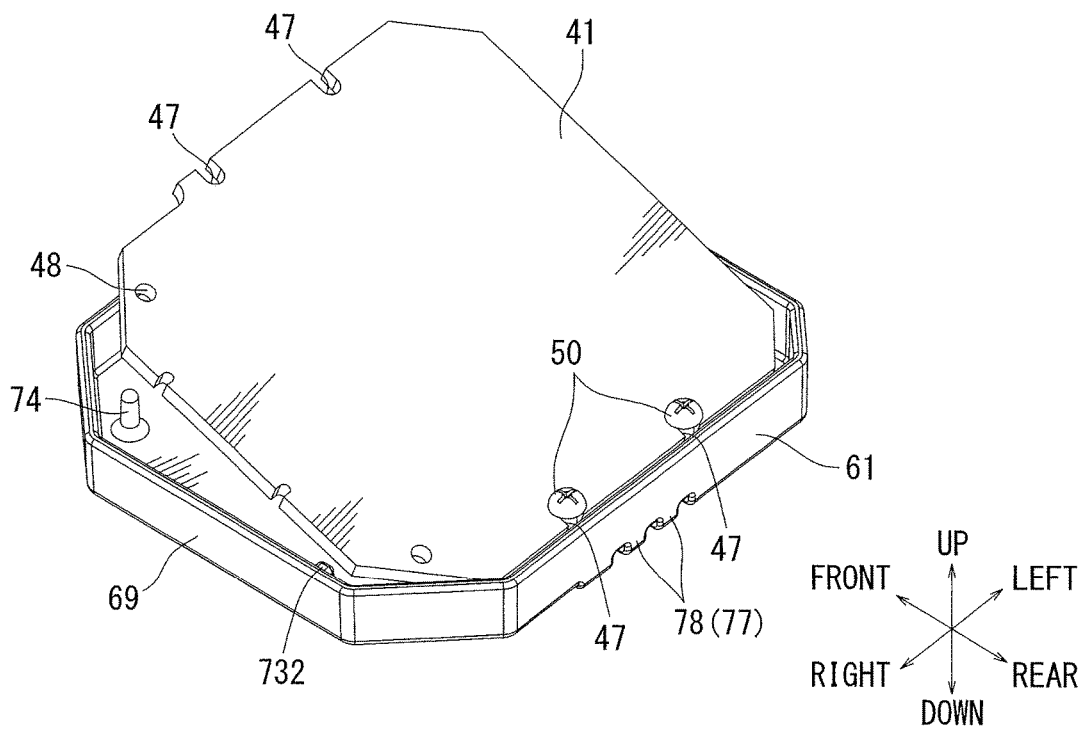
FIG. 14 is a perspective view showing how the circuit board is attached to the heat radiation case.
Figure 15:
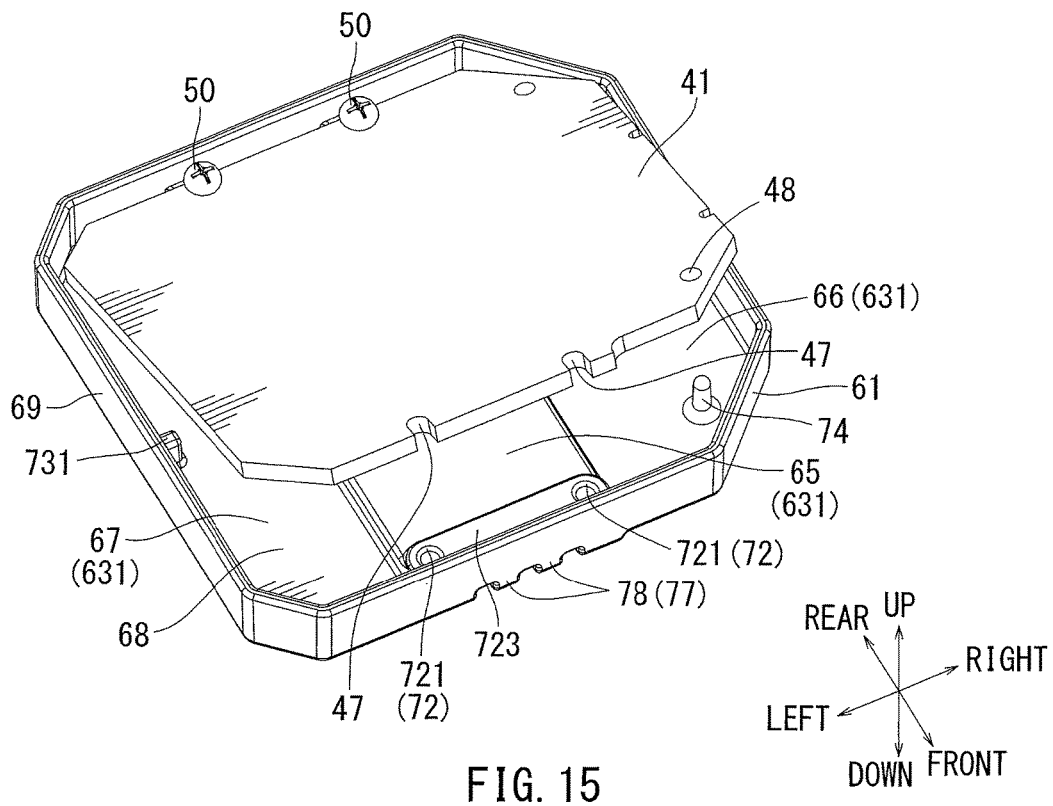
FIG. 15 is a view seen obliquely from the opposite side of FIG. 14.
Figure 16:
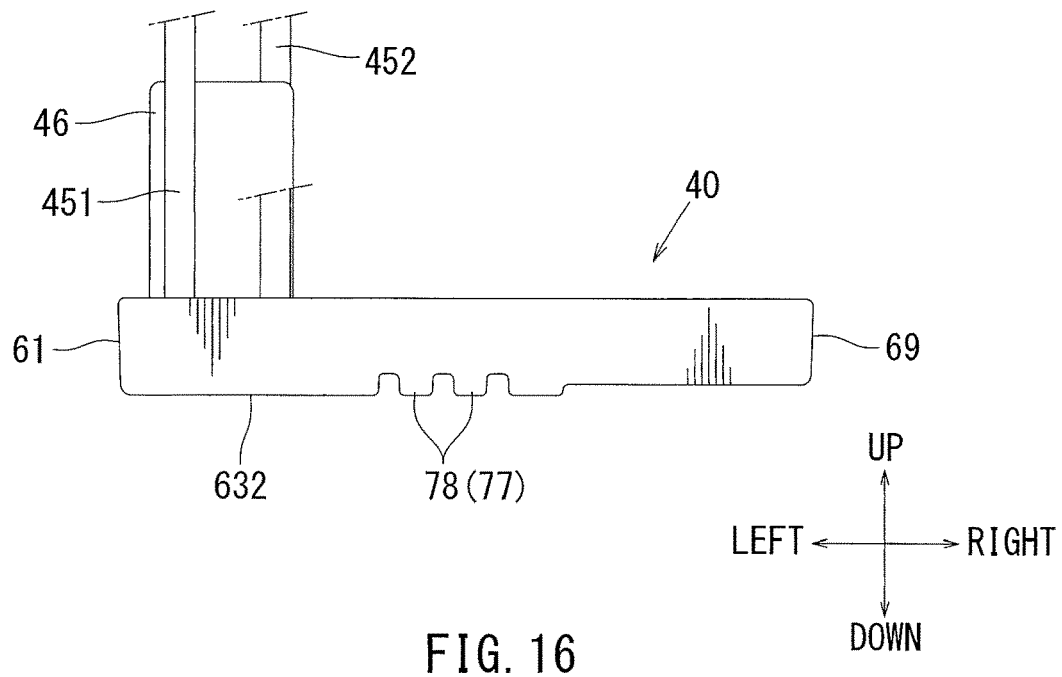
FIG. 16 is a side view showing that power lines are arranged in the controller.

Next, the male screw members 50 may be temporarily fixed to the rear-side female screw portions 71 of the heat radiation case 61. This temporal fixing means a state in which the male screw members 50 are slightly screwed (slight screwing). The male screw members 50 which are temporarily fixed to the rear-side female screw portions 71 may function as positioning bosses when the circuit board 41 is attached to the heat radiation case 61. As shown in FIGS. 14 and 15, the circuit board 41 may be slightly inclined such that the rear-side screwing grooves 47 provided in the circuit board 41 may be fitted to the male screw members 50 which are temporarily fixed to the rear-side female screw portions 71. After the rear-side screwing grooves 47 are fitted to the male screw members 50, the front side of the circuit board 41 may be brought down close to the heat radiation case 61. At this time, it may be necessary to confirm that the positioning pin 74 of the heat radiation case 61 is fitted to the positioning hole 48 in the circuit board 41. After the positioning pin 74 portion is fitted to the positioning hole 48, the male screw members 50 may be inserted into the front-side screwing grooves 47 provided in the circuit board 41. The male screw members 50 may be screw-fastened to the front-side female screw portions to thereby fix the front portion of the circuit board 41 to the heat radiation case 61. After that, the temporarily fixed male screw members 50 may be screw-fastened to the rear-side female screw portions 71 to thereby fix the rear portion of the circuit board 41 to the heat radiation case 61.

As described above, the front side and the rear side of the circuit board 41 may be fixed to the heat radiation case 61 through the screw fastening of the male screw members 50. When the circuit board 41 is fixed to the heat radiation case 61, the first area A1 of the circuit board 41 may face the first facing part 65 of the heat radiation case 61 with the insulating sheet 80 being placed between the circuit board 41 and the first facing part 65 as shown in FIG. 12. As shown in FIG. 13, a number of FETs 42 mounted on the first area A1 may press and closely contact the insulating sheet 80. As described above, the insulating sheet 80 may be attached to the first facing part 65. Accordingly, the insulating sheet 80 pressed from the first area A1 of the circuit board 41 may receive a pressing force from the first facing part 65 and closely contact the first facing part 65. Through the insulating sheet 80, which may be pressed and deformed as described above, the FETs 42 mounted on the circuit board 41 may be electrically insulated from the first facing part 65 (the heat radiation case 61) and also heat may be exchanged between the FETs 42 and the first facing part 65 (the heat radiation case 61). Furthermore, as described above, the ground patterns (not shown) of the circuit board 41 may directly contact the peripheral flange portions 713 and the connected flange portion 723 while the screw fastening force of the male screw members 50 is applied to the circuit board 41.

As shown in FIG. 12, the second area A2 of the circuit board 41 may face the second facing part 66 of the heat radiation case 61 at a close distance. Electric components 44 mounted on the second area A2 of the circuit board 41 may have a larger protrusion amount from the board surface 43 than that of FETs 42 mounted on the first area A1, and also may have a smaller protrusion amount from the board surface 43 than that of soldered part 49 of the electric components mounted on the third area A3. The electric components 44 mounted on the second area A2 of the circuit board 41 may face the second facing part 66 in a suitable and close distance. Accordingly, the circuit board 41 including the electric components 44 may be positioned apart from the second facing part 66 (the heat radiation case 61). A mold material (resin material) 90 may fill a space between the circuit board 66 and the second facing part 66, which will be described later. Through the mold material 90, heat can be exchanged between the circuit board 41 including the electric components 44 and the second facing part 66. Furthermore, as shown in FIG. 12, the third area A3 of the circuit board 41 may face the third facing part 67 of the heat radiation case 61 with a close distance. The soldered parts 49 of the electric components mounted on the third area A3 of the circuit board 41 may have a larger protrusion amount from the board surface 43 than that of the electric components 44 mounted on the second area A2. The soldered parts 49 of the electric components mounted on the third area A3 of the circuit board 41 may face the third facing part 67 in a suitable and close distance. Accordingly, the circuit board 41 including the soldering portions 49 may be positioned apart from the third facing part 67 (the heat radiation case 61). The mold material (resin material) 90 may fill a space between the circuit board 41 and the third facing part 67, which will also be described later. Through the mold material 90, heat can be exchanged between the circuit board 41 including the soldering portions 49 and the third facing part 67.

Figure 17:
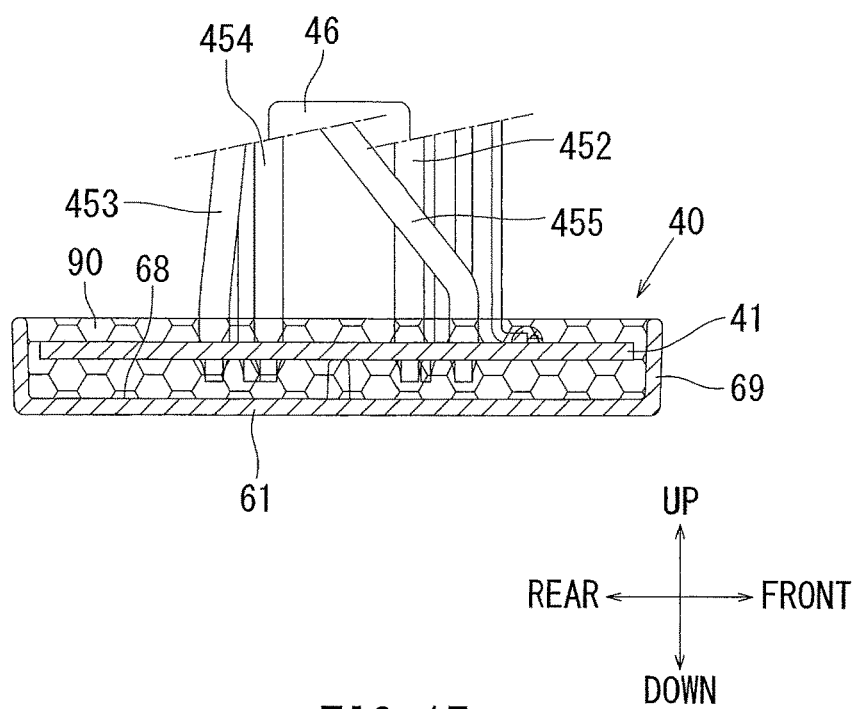
FIG. 17 is a cross-sectional view, taken from line (XVII)-(XVII) of FIG. 3, showing that the controller is filled with resin material.

As described above, the resin material 90 having an insulation property may be injected to fill recessed parts of the heat radiation case 61. As shown in FIG. 17, the resin material 90 may be injected to fill a space between the circuit board 41 and the heat radiation case, and will become a solid mold material 90 when it dries. The mold material 90 may increase a waterproof function and a dust-proof function of the circuit board 41 on which the electric components are mounted.

In the disc grinder 10 configured as described above, the following effects can be obtained. According to the above disc grinder 10, the first facing part 65 may be provided in the facing part 631 of the heat radiation case 61, and a distance between the board surface 43 of the circuit board 41 and the facing part 631 (the first facing part 65) may be reduced by the first step 641 and the second step 642. Because of this, electric components may be mounted on the circuit board 41 corresponding to a relative distance between the board surface 43 of the circuit board 41 and the facing part 631. Electric components such as the FETs 42 may be mounted on the first facing part 65 and heat may be effectively exchanged between the FETs and the heat radiation case 61. In this way, the heat radiation effect of the controller 40 itself may be sufficiently and/or effectively increased, while the size and thickness of the controller 40 including the circuit board 41 and the heat radiation case 61 may be reduced by selectively mounting the electric components. Furthermore, according to the above disc grinder 10, the FETs 42 may contact the first facing part 65 through the insulating sheet 80. Because of this construction, heat exchange between the FETs 42 and the heat radiation case 61 may be efficiently performed. Thus, heat radiation effect by the heat radiation case 61 may be further increased.

Furthermore, according to above disc grinder 10, the electric components mounted on the circuit board 41 may be classified into three groups according to the protrusion amount of the electric components from the board surface 43 of the circuit board 41, and may be mounted on the areas sectioned on the board surface 43 according to the three classifications. The first facing part 65 may correspond to the first area A1 defined by the first step 641 and the second step 642. The electric components such as the FETs 41 for supplying electric power to the electric motor 22 may form the first group G1 and be mounted on the first area A1. Accordingly, the first area A1 may be advantageously and/or effectively used for the heat radiation of the FET 42 for supplying electric power to the electric motor 22. The second facing part 66 may correspond to the second area A2. Electric components for controlling the FETs 42 may form the second group G2 and be mounted on the second area A2. Accordingly, the second area A2 may be advantageously and/or effectively used for the heat radiation of the electric components for controlling the FETs 42. The third facing part 67 may correspond to the third area A3. Electric components such as electric wires for supplying electric power from the power source to the electric motor 22 may form the third group G3 and be mounted on the third area A3. Accordingly, the third area A3 may be advantageously and/or effectively used for the heat radiation of the electric components such as the electric wires for supplying electric power from the power source to the electric motor 22.

Furthermore, according to the above disc grinder 10, the two electric wires 451 and 452 connected to the rechargeable battery B may be positioned such that the capacitor 46 mounted on the circuit board 41 may be located between the two electric wires 451 and 452. Thus, the two electric wires 451 and 452 may be located in a dead space produced by the arrangement of the capacitor 46. Accordingly, it may be possible to reduce the size of the circuit board 41 by reducing the dead space on the circuit board 41. Furthermore, according to the above disc grinder 10, the insulating sheet 80 may contact both the FET 42 in the first area A1 and the first facing part 65 while the FETs 42 are electrically insulated from the first facing part 65. Thus, thermal conductivity between the FETs 42 and the first facing part 65 can be increased while the electrical insulating property between the FETs 42 and the first facing part 65 may be held. Accordingly, the heat radiation effect of the heat radiation case 61 especially with respect to the FETs 42 can be further increased. Furthermore, according to the above disc grinder 10, the conductor patterns (ground patterns) directly contacting the heat radiation case 61 may be provided on the circuit board 41. Through the conductor patterns (ground patterns), heat may be easily exchanged between the electric components (FETs 42) and the heat radiation case 62. Accordingly, the heat radiation effect of the heat radiation case 61 can be further increased.

Furthermore, according to the above disc grinder 10, the conductor patterns (ground patterns) that directly contact the heat radiation case 61 may be located in the first area A1. Therefore, the heat radiation of the FETs 42 can be advantageously and/or effectively performed through the conductor patterns (ground patterns). Furthermore, according to the above disc grinder 10, the heat radiation case 61 may be screw-fastened to the circuit board 41 by the male screw members 50 at the places where the heat radiation case 61 directly contacts the conductor patterns (ground patterns). Accordingly, the direct contact between the heat radiation case 61 and the conductor patterns (ground patterns) may be further increased. Thus, through the conductor patterns (ground patterns), heat exchange between the heat radiation case 61 and the circuit board 41 including the FETs 42 may be effectively and/or advantageously performed, and the heat radiation effect can be further increased. Furthermore, according to the above disc grinder. 10, the potential of the heat radiation case 61 may be defined by the contact of the heat radiation case to the conductor patterns (ground patterns), and therefore, it may be possible to prevent failures in the electric components when static electricity is applied to the disc grinder 10.

Furthermore, according to the above disc grinder 10, the male screw members 50 temporarily fixed to the two rear-side female screw portions 71 provided in the heat radiation case 61 may function as positioning bosses when the circuit board 41 is attached to the heat radiation case 61. Accordingly, it may be easy to position the circuit board 41 with respect to the heat radiation case 61 when the circuit board 41 is attached to the heat radiation case 61. Therefore, the circuit board 41 may be easily and/or simply attached to the heat radiation case 61. In this way, assembly work can be easily performed. Furthermore, other positioning member(s) and other positioning space may not be necessary when the circuit board 41 is attached to the heat radiation case 61, and thus the size of the controller 40 may be reduced.

Furthermore, according to the above disc grinder 10, the heat radiation structure 77 having the concave-convex shape may be provided in the outer surface part 632 which is the opposite side of the first facing part 65 of the heat radiation case 61. Therefore, the surface area of the heat radiation case 61 may be increased, and thus the heat radiation effect of the circuit board 41 including the FET 42 may be increased. Furthermore, it may be possible to suppress deformation (sink marks) generated by the thickness difference when the heat radiation case 61 is formed. Furthermore, the heat radiation case 61 may also be used for a case for housing the circuit board 41, and thus the circuit board 41 may not be exposed and may be prevented from being damaged. Furthermore, the surface area of the heat radiation case 61 may be defined to surround the circuit board 41. Accordingly, the heat radiation effect of the heat radiation case 61, and eventually of the circuit board 41 including the FETs 42 may be increased.

The electric power tool according to the present embodiment is not limited to the above embodiment and can be modified in the following way. In the above embodiment, the electric components mounted on the circuit board 41 may be classified into three groups according to the protrusion amount of the electric components from the board surface 43 of the circuit board 41. However, the electric components may be classified into two or four groups, and the electric components may be mounted on areas sectioned on the board surface 43 according to the classifications. Furthermore, the relative distances of the first facing part 65, the second facing part 66 and the third facing part 67 with respect to the board surface 43 may be suitably defined according to the electric components to be mounted.

What is claimed is:

1. An electric power tool comprising:
   a motor; and
   a controller for controlling the motor;
   wherein:
   the controller includes:
     a circuit board having a first surface on which electric components are mounted; and
     a heat radiation member that (1) radiates heat of the electric components and (2) includes a facing surface which (a) faces the first surface of the circuit board and (b) is parallel to the first surface of the circuit board;
   the facing surface includes a first facing surface part and a second facing surface part;
   the first surface facing part is spaced from the first surface by a first distance and the second facing surface part is spaced from the first surface by a second distance;
   the first distance is not equal to the second distance;
   the first facing surface part and the second facing surface part each include an opposite, outside surface that does not face the circuit board;
   the outside surface of the first facing surface part has a concave-convex shape; and
   the outside surface of the second facing surface part has a substantially flat, planar shape.

2. The electric power tool according to claim 1, wherein:
   the electric components include a switching device for supplying electric power to the motor; and
   the first facing surface part contacts the switching device such that heat is exchanged between the heat radiation member and the switching device.

3. The electric power tool according to claim 1, wherein:
   the electric components are classified into classifications according to a protrusion amount from the first surface of the circuit board on which the electric components are mounted, the electric components being mounted on areas sectioned on the first surface of the circuit board according to the classifications; and the first facing surface part and the second facing surface part correspond to the areas sectioned on the first surface of the circuit board according to the classifications.

4. The electric power tool according to claim 3, wherein:
the classifications include a first group which forms a group of switching devices for supplying electric power to the motor;
the first group is arranged in a first area sectioned on the first surface of the circuit board; and
the first facing surface part is configured to correspond to the first area.

5. The electric power tool according to claim 4, wherein:
the classifications include a second group which forms a group of electric components for controlling the group of switching devices;
the second group is arranged in a second area sectioned on the first surface of the circuit board; and
the second facing surface part is configured to correspond to the second area.

6. The electric power tool according to claim 4, wherein:
the classifications include a third group which forms a group of electric wires for supplying electric power from a power source to the motor;
the third group is arranged in a third area sectioned on the first surface of the circuit board; and
the second facing surface part is configured to correspond to the third area.

7. The electric power tool according to claim 6, wherein two of the group of electric wires are positioned such that a capacitor is placed between the two of the group of electric wires.

8. The electric power tool according to claim 4, wherein an insulating sheet is placed between the first area of the first surface of the circuit board and the first facing surface part of the heat radiation member such that the insulating sheet contacts both the group of switching devices and the first facing surface part and the group of switching devices is electrically insulated from the first facing surface part.

9. The electric power tool according to claim 4, wherein a conductor pattern for directly contacting the heat radiation member is provided on the circuit board.

10. The electric power tool according to claim 9, wherein the conductor pattern is located in the first area.

11. The electric power tool according to claim 9, wherein the heat radiation member is fixedly screwed to the circuit board through screw members at places where the heat radiation member directly contacts the conductor pattern.

12. The electric power tool according to claim 11, wherein:
the heat radiation member includes female screw receptacles for the screw members; and
when the screw members are temporarily fixed to the female screw receptacles, the screw members function as positioning bosses when the circuit board is attached to the heat radiation member.

13. The electric power tool according to claim 1, wherein the heat radiation member is configured to serve as a case in which the circuit board is housed.

14. The electric power tool according to claim 1, wherein the outside surface of the first facing surface part does not extend outwardly beyond the outside surface of the second facing surface part.

15. The electric power tool according to claim 1, wherein:
the first distance is shorter than the second distance; and
heat of the electric components is radiated via the first facing surface part.

16. A controller for controlling a motor of an electric power tool, the controller comprising:
a circuit board having a first surface on which electric components are mounted; and
a heat radiation member that (1) radiates heat of the electric components and (2) includes a facing surface which (a) faces the first surface of the circuit board and (b) is parallel to the first surface of the circuit board; wherein:
the facing surface includes a first facing surface part and a second facing surface part;
the first surface facing part is spaced from the first surface by a first distance and the second facing surface part is spaced from the first surface by a second distance;
the first distance is not equal to the second distance;
the first facing surface part and the second facing surface part each include an opposite, outside surface that does not face the circuit board;
the outside surface of the first facing surface part has a concave-convex shape; and
the outside surface of the second facing surface part has a substantially flat, planar shape.

17. The controller according to claim 16, wherein the outside surface of the first facing surface part does not extend outwardly beyond the outside surface of the second facing surface part.

18. The controller according to claim 16, wherein:
the first distance is shorter than the second distance; and
heat of the electric components is radiated via the first facing surface part.

19. The controller according to claim 16, wherein:
the electric components include a switching device for supplying electric power to the motor; and
the first facing surface part contacts the switching device such that heat is exchanged between the heat radiation member and the switching device.

20. The controller according to claim 16, wherein:
the electric components are classified into classifications according to a protrusion amount from the first surface of the circuit board on which the electric components are mounted, the electric components being mounted on areas sectioned on the first surface of the circuit board according to the classifications; and
the first facing surface part and the second facing surface part correspond to the areas sectioned on the first surface of the circuit board according to the classifications.

* * * * *